(12) United States Patent
Raisoni

(10) Patent No.: US 10,757,829 B2
(45) Date of Patent: Aug. 25, 2020

(54) MODULAR SERVER

(71) Applicant: Rahi Systems Inc., Fremont, CA (US)

(72) Inventor: Tarun Raisoni, San Jose, CA (US)

(73) Assignee: Rahi Systems Inc., Fremont, CA (US)

( * ) Notice: Subject to any disclaimer, the term of this patent is extended or adjusted under 35 U.S.C. 154(b) by 0 days.

(21) Appl. No.: 15/494,565

(22) Filed: Apr. 24, 2017

(65) Prior Publication Data

US 2017/0311474 A1 Oct. 26, 2017

Related U.S. Application Data

(60) Provisional application No. 62/326,829, filed on Apr. 24, 2016.

(51) Int. Cl.
*H05K 7/00* (2006.01)
*H05K 7/14* (2006.01)

(52) U.S. Cl.
CPC ......... *H05K 7/1487* (2013.01); *H05K 7/1489* (2013.01)

(58) Field of Classification Search
None
See application file for complete search history.

(56) References Cited

U.S. PATENT DOCUMENTS

| | | | |
|---|---|---|---|
| 5,277,615 A * | 1/1994 | Hastings | G06F 1/181 361/679.32 |
| 5,816,673 A * | 10/1998 | Sauer | G06F 1/184 312/223.2 |
| 6,793,517 B2 * | 9/2004 | Neer | H05K 5/0256 439/372 |
| 6,952,343 B2 * | 10/2005 | Sato | G06F 1/1626 361/679.57 |
| 7,317,613 B2 * | 1/2008 | Quijano | F16M 11/041 16/323 |
| 7,839,624 B2 * | 11/2010 | Lin | G06F 1/184 361/679.02 |
| 7,894,195 B2 * | 2/2011 | Lin | H05K 7/1487 361/727 |
| 8,287,192 B2 * | 10/2012 | Teo | G02B 6/4201 385/88 |
| 8,477,496 B2 * | 7/2013 | Zhang | G06F 1/187 165/122 |
| 9,125,502 B2 * | 9/2015 | Gwag | A47F 5/0884 |
| 9,291,298 B2 * | 3/2016 | Shin | G06F 1/1601 |
| 9,301,419 B1 * | 3/2016 | Tsai | H05K 7/1438 |
| 9,402,328 B2 * | 7/2016 | Xu | H05K 7/20727 |
| 9,829,935 B2 * | 11/2017 | Shaw | G06F 13/4022 |
| 10,133,302 B2 * | 11/2018 | Yuan | H05K 7/1491 |

(Continued)

*Primary Examiner* — Jinhee J Lee
*Assistant Examiner* — Rashen E Morrison
(74) *Attorney, Agent, or Firm* — Horizon IP Pte Ltd

(57) ABSTRACT

Disclosed is a modular server that allows for the simple replacement of the system board, memory and key network components in a single system tray to form a system module. The system module is connected to a storage plane with hard drives through a mid-plane with power and data channels. The system module can be easily replaced or upgraded independently of the mid-plane and storage plane. This extends the life cycle of the server chassis and associated components such as hard drives and power module when upgrading, resulting in overall savings for the owner of this system.

24 Claims, 4 Drawing Sheets

(56) References Cited

U.S. PATENT DOCUMENTS

| | | | |
|---|---|---|---|
| 2008/0191590 A1* | 8/2008 | Lin | G11B 33/128 312/223.2 |
| 2010/0172087 A1* | 7/2010 | Jeffery | G11B 33/02 361/679.33 |
| 2013/0141863 A1* | 6/2013 | Ross | G11B 33/128 361/679.33 |
| 2016/0095246 A1* | 3/2016 | Noland | H05K 7/1489 361/679.31 |
| 2016/0211623 A1* | 7/2016 | Sharf | H01R 13/665 |

* cited by examiner

MODULAR SERVER

CROSS-REFERENCE TO RELATED APPLICATIONS

This application claims the priority of U.S. Provisional Application No. 62/326,829, entitled "Flexible Server" filed on Apr. 24, 2016, which is herein incorporated by reference in its entirety.

BACKGROUND

Networked-based or internet-based computing, such as cloud computing, provides shared computer processing resources and data to computers and other devices on demand. Such computing model enables on-demand access to a shared pool of configurable computing resources which can be provisioned and released with minimal management effort. Cloud computing proves processing and storage solutions to users and enterprises with various capabilities to store and process data in either privately owned or third-party data centers.

At the heart of cloud computing are servers. Numerous servers are interconnected in a data center or server farm to provide the shared resources. However, the current life cycle of servers is short, due to the fast generation changes in technology and ever-growing demand for increased performance in cloud computing. To implement the next generation of technology, current servers require an entire server or system change. Changing complete systems to effect performance upgrade is costly. In addition, changing in components of conventional servers due to defects is complicated, making it time-consuming and costly.

The present disclosure is directed to a server which is flexible, easy and cost efficient for effecting performance upgrades and repairs.

SUMMARY

A modular server is disclosed. The modular server includes a storage plane having hard drives of the server, a system plane having a processor module and system components, and a mid-plane having a power module. The modular server further includes power and data connector assemblies coupling power and data signals between the system plane and storage plane via the mid-plane. The system plane is separated from the mid-plane and the storage plane to enable independent replacement of the system plane from the mid-plane and storage plane.

DESCRIPTION

Figure 1:
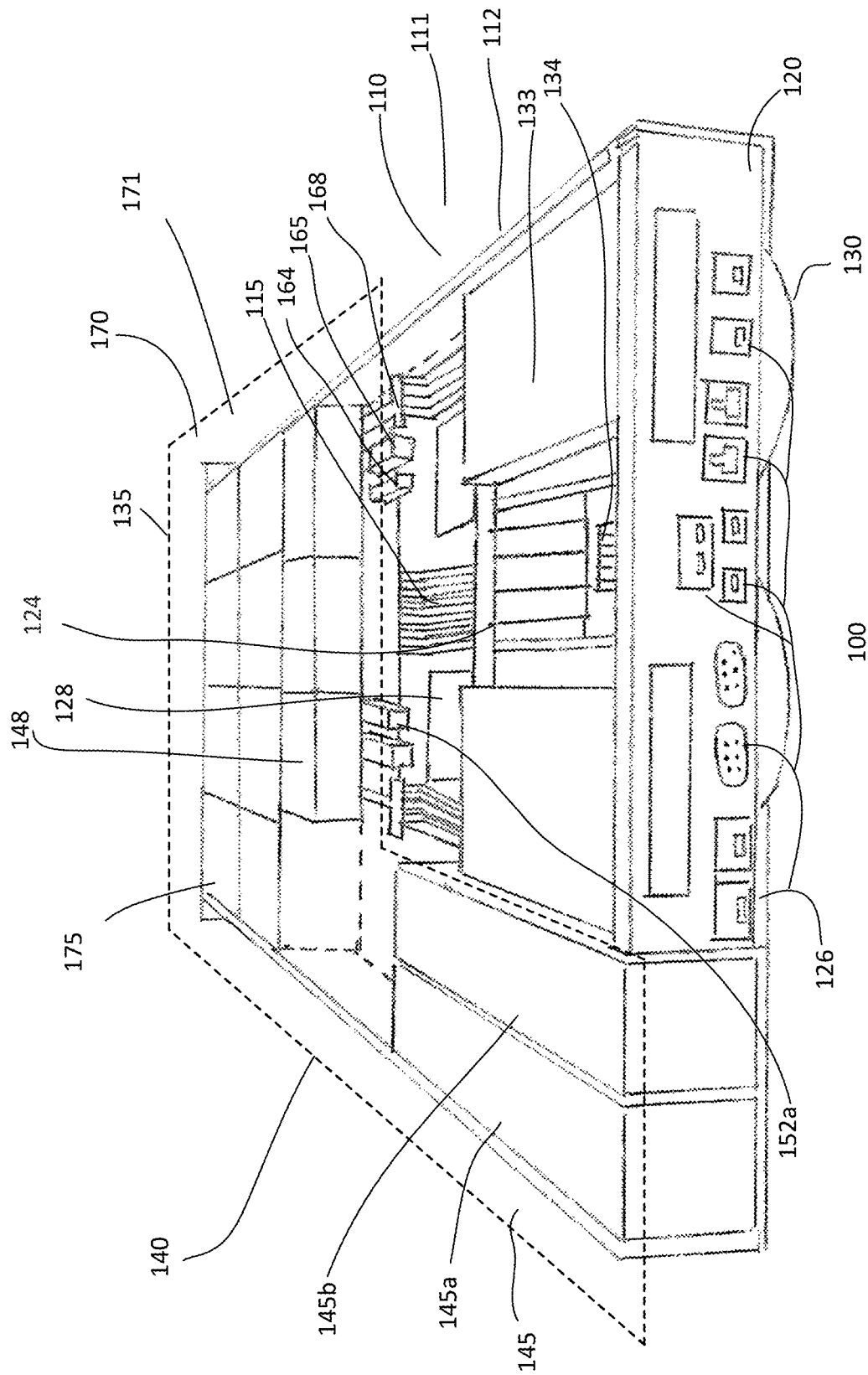
FIG. 1 shows an upper rear view (open top) of an exemplary server.
Figure 2:
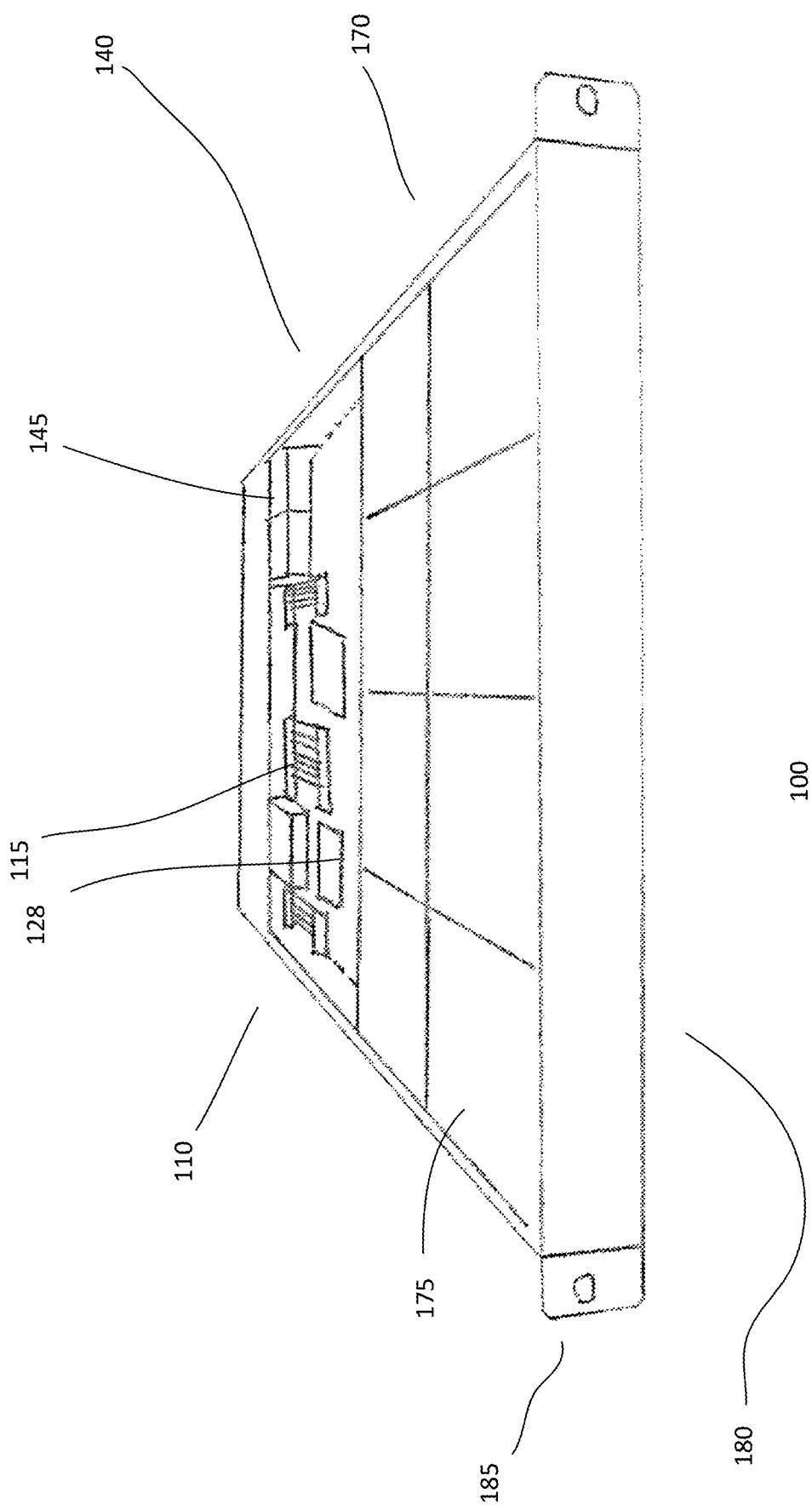
FIG. 2 shows an upper front view (open top) of an exemplary server.

FIGS. 1 and 2 show front and back view of an embodiment of a server 100. In one embodiment, the server is a modular server. The modular server includes a server frame or chassis 112. The server frame houses a front plane 170, a mid-plane 140 and a back-plane 110. The back-plane plane serves as a system plane 111. As for the front plane, it serves as a data or storage plane 171. The mid-plane serves as a common or interface plane which provides power to the connections between the front plane and back-plane. In one embodiment, the back-plane or system plane is a separate physical plane from the mid-plane and the front or storage plane. For example, the mid-plane and the front plane form a single or integrated plane 135 while the front plane is a distinct plane which can be easily separated from the integrated plane.

As discussed, the integrated plane includes the front plane and the mid-plane. The integrated plane, in one embodiment, includes an integrated plane circuit board which encompasses both the front plane and the mid-plane circuit boards. Providing separate front plane and mid-plane circuit boards may also be useful. For purposes of discussion, the reference to a mid-plane, a front plane or an integrated plane may refer to the integrated plane or separate mid-plane and front plane. The server frame includes a front server panel 180. The front server panel includes mounting ears 185 for mounting the server onto a server rack containing a plurality of servers. The middle portion of the front server panel may include a front server grill portion for facilitating air flow for cooling purposes.

The front plane, in one embodiment, includes hard drives 175 for storing information. The hard drives may also store applications. Alternatively, hard drives may be dedicated for storing data in the case of a data server or applications in the case of an application server. Other configurations of hard drives may also be useful. The front plane, as shown, includes 8 hard drives. Providing the front plane with other number of hard drives may also be useful. In one embodiment, the hard drives are configured to be easily replaced. For example, each hard drive can be replaced individually. Replacement of hard drives can be easily achieved by providing hard drive connectors mounted on the integrated or front plane circuit board. Replacement of a hard drive can be for the purpose of replacing a defective hard drive or for upgrading a hard drive.

In one embodiment, the integrated or mid-plane includes fans 148 to further facilitate cooling the server during operation. As shown, the server includes 6 fans. Providing other number of fans may also be useful. The mid-plane includes a power module 145. The portion of the integrated or mid-plane which the power module occupies may extend to the back of the server or server frame. This facilitates easy monitoring of whether the server has power or not from the back of the server. The power module includes at least one power unit. As shown, the power module includes two power units 145*a* and 145*b*. Providing other number of power units for the power module may also be useful. The second power unit shares the power load of the server as well as serving as a backup power unit in the case the first power unit becomes inoperable or vice-versa. In addition, a battery supply may be provided for RAID cards for the hard drives in the event of power failure.

The back-plane, as discussed, can be easily detached or connected to the integrated or mid-plane. In one embodiment, the back-plane serves as a system plane disposed on a system tray, forming a system module. The module board can be easily removed or inserted as part of the server. In one embodiment, the server frame includes guides which enable easy insertion and removal of the system module into and from the server.

The system module plane, as described, includes the system tray which includes the system board. The system board, in one embodiment, includes a processing module 128. As shown, the system board of the system tray includes two processing modules. Other number of processing modules may also be useful. A processing module may include one or more processors. The processing module may typically be a single or a dual socket module for accommodating 1 or 2 processors. In one embodiment, the processor module includes a dual socket for accommodating 2 processors. Other number of processors for a processing module may also be useful.

The system tray may also include other system components mounted on the system board. In one embodiment, the system board includes a plurality of memory slots 115 and expandable mezzanine card slots 134, such as 40G mezzanine card slots. The system board may also include PCIe slots 133. For example, the system board may include two full-size PCIe slots in a 1 u form factor. The system board may also include a plurality of network connections. The network connections may be different types of network interfaces, such as USB, mini-SAS for external disk arrays and SFP+ NICs. Other types of network connections may also be included. The system board includes a connection panel 120. The connection panel includes a plurality of external connectors 126 for connecting to the different types of network interfaces and/or external storage or monitors. The various components of the system tray provide robust performance to the server. A heat sink 124 may be provided, for example, between the PCIe slots modules for dissipating heat.

The front plane and mid-plane include coupling assemblies 164 and 165. One of the coupling assemblies serves as a power coupling assembly and the other serves as a data coupling assembly. The power coupling assembly provides power from the power module to the system and storage planes. The data coupling assembly provides data signals between the system and storage planes. An assembly, for example, is a coupling unit. As shown, the front plane and mid-plane include dual power and data coupling units. One of the dual power and data coupling units is located on one side of the system tray on the front and mid-planes and the other is located on the other side of the system tray on the front and mid-planes.

A coupling assembly includes first and second coupling connectors. One of the coupling connectors, such as the first coupling connector, is disposed on the front plane and the other coupling connector, such as the second coupling connector, is disposed on the mid-plane. The coupling connectors are configured to mate to provide power and data connections between the planes. For example, one of the coupling connectors is a male coupling connector with coupling pins while the other coupling connector is a female coupling connector with coupling pin receptors.

It is understood that the different coupling assemblies may have different configurations of coupling connectors. As described, the mid-plane of the server includes two power units as well as two power and data channels disposed on either side of the system board. For example, one power channel and one data channel are disposed on one side of the system board and the other power channel and the other data channel are disposed on the other side of the system board.

The front and mid-planes may include one or more alignment assemblies 168. In one embodiment, the front and mid-planes include first and second alignment assemblies. Each of the alignment assemblies is located on each side of the system tray on the front and mid-planes. An alignment assembly includes first and second alignment connectors, one on the front plane and one on the mid-plane. One of the alignment connectors is a male alignment connector with a guide pin for insertion into the other which is a female alignment connector. The alignment assemblies facilitate alignment of the front plane with the mid-plane with inserted guide pin. This ensures secure coupling of the connectors of the power and data assemblies.

The system tray may also include a system tray lock module 130. In one embodiment, the system tray lock module includes first and second lock handles or levers disposed under first and second sides of the system tray and accessible from the front of the server. As shown, the system tray lock is in the lock position, locking the system tray into position with the mid-plane. The system tray lock levers may be disengaged to unlock the system tray. For example, the lock levers may be extended or rotated outward away from the front of the server. Unlocking the system tray enables it to be removed by sliding it away from the server. Other types of tray lock modules may also be useful.

Figure 3:
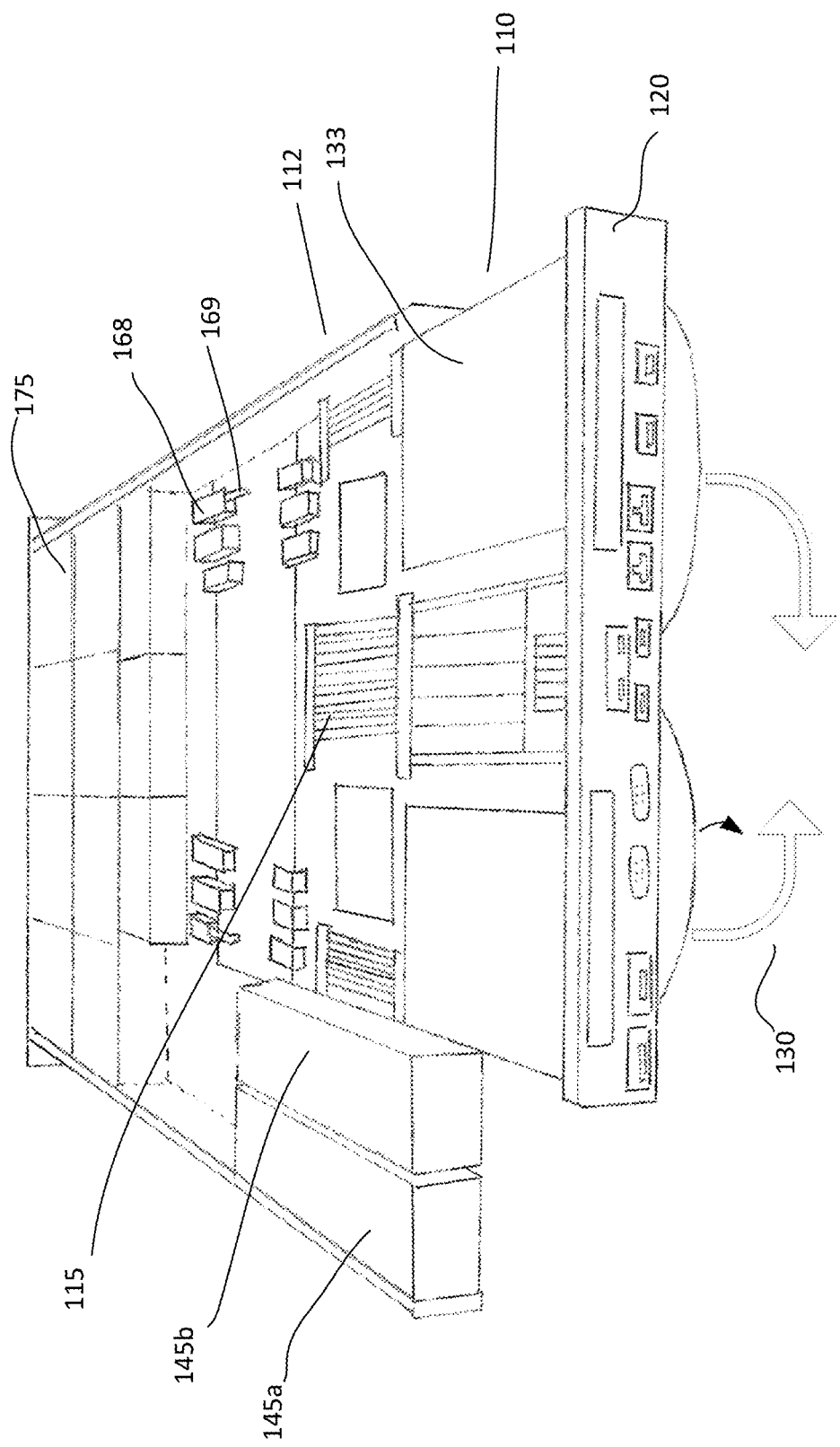
FIG. 3 shows an upper rear view (open top) of an exemplary server with the system module partially detached therefrom.

FIG. 3 shows an embodiment of a server 100 in which the system tray 110 is detached by having the lock 130 released. The mid-plane shows the male connector of the alignment assembly 168 with a guide pin 169.

Figure 4:
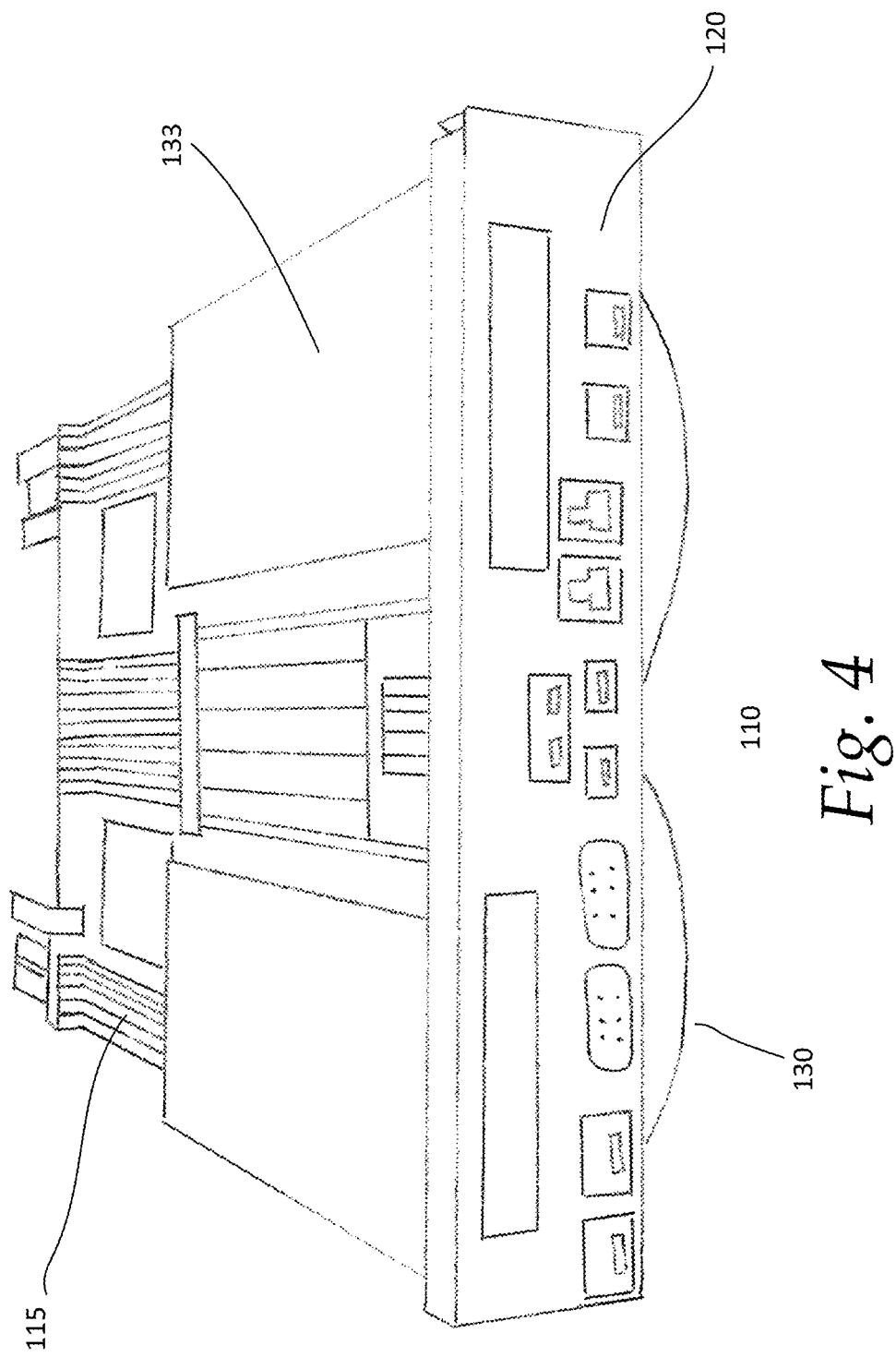
FIG. 4 shows an exemplary standalone system module.

FIG. 4 shows a stand-alone system tray 110. The various elements of the server and system tray have already been described. The tray, for example, includes 2 groupings of connectors on either side of the system board tray. In addition, guide pins are provided on the end of the tray. This allows for very simple and smooth connection to the mid-plane of the physical server. Furthermore, providing built-in hardwired pin connections for power and data connections via the mid-plane avoids the need of cable bus connections, as in conventional servers. This greatly simplifies the ability to repair or upgrade a system. For example, the server can be upgraded by replacing the system tray with upgraded processors. Alternatively, a defective system tray can easily be replaced with a new or functional system tray. As such, the life span of an existing server chassis and its associated drives and power module can be extended. Faster and more cost-effective upgrading is achieved by upgrading without having to replace the entire server. This results in overall savings for the owner of this system.

The invention may be embodied in other specific forms without departing from the spirit or essential characteristics thereof. The foregoing embodiments, therefore, are to be considered in all respects illustrative rather than limiting the invention described herein. The scope of the invention is thus indicated by the appended claims, rather than by the foregoing description, and all changes that come within the meaning and range of equivalency of the claims are intended to be embraced therein.

The invention claimed is:

1. A modular server comprising: a server chassis having first and second opposing ends, wherein the server chassis houses a storage plane, a mid-plane and a system plane: wherein the storage plane contains hard drives of the server, wherein the storage plane is disposed proximate to the first opposing end of the server chassis: wherein the mid-plane is coupled to the storage plane, the mid-plane comprises a first mid-plane section which extends to the second opposing end of the server chassis and a second mid-plane section which is retracted from the second opposing end of the server chassis, the first mid plane portion comprises a power module, the second mid-plane section is configured to accommodate the system plane; wherein the system plane comprises a system tray with a processor module and system components disposed thereon, the second mid-plane portion is coupled to the system plane, the system plane is configured to be insert able into and removable from the server chassis, wherein when the system plane is inserted into the server chassis, the first mid plane section and the system plane are at the second opposing end of the server chassis, and when the system plane is removed from the server chassis, the system plane is decoupled from the mid-plane; and power and data connector assemblies, the power and data connector assemblies are disposed on the mid-plane and the system plane, the power and data connector assemblies couple power and data signals between the system plane and the storage plane via the mid-plane, the power and data connector assemblies facilitate easy coupling of the system plane to the mid-plane for inserting the system plane into the server chassis and easy decoupling of the system plane from the mid-plane for removing the system plane from the server chassis.

2. The modular server of claim 1, wherein the server chassis is configured to facilitate insertion of the storage plane for engagement with the mid-plane.

3. The modular server of claim 2 wherein the system tray facilitates insertion and removal of the system plane for engagement and disengagement of the system plane with the mid-plane.

4. The modular server of claim 3 wherein the system plane comprises a lock module, the lock module, when
  in the lock position, locks the system plane to the server chassis to ensure engagement of the system plane to the mid-plane; and
  in the unlock position, enables insertion and removal of the system plane for engaging and disengaging the system plane with the mid-plane.

5. The modular server of claim 4 wherein the lock module comprises first and second lock levers disposed on first and second sides of the system plane, the levers rotate from lock to unlock positions.

6. The modular server of claim 1 wherein the storage plane and mid-plane comprise an integrated plane.

7. A modular server comprising:
  a storage plane containing hard drives of the server;
  a system plane comprising
    a processor module, and
    system components;
  a mid-plane, the mid-plane comprises a power module; and
  power and data connector assemblies which couple power and data signals between the system plane and the storage plane via the mid-plane, wherein
    the system plane is separated from the mid-plane and the storage plane to enable independent replacement of the system plane from the mid-plane and the storage plane,
    the mid-plane and the system plane comprise the power connector assembly, the power assembly having a first power coupling connector on the system plane and a second power coupling connector on the mid-plane, wherein one of the first and second power coupling connectors is a male power coupling connector with coupling pins and the other of the first and second power coupling connectors is a female power coupling connector with coupling pin receptors, the first and second power coupling connectors are mated when the system plane is engaged with the mid-plane, and
    the mid-plane and the system plane comprise the data connector assembly having a first data coupling connector on the system plane and a second data coupling connector on the mid-plane, wherein one of the first and second data coupling connectors is a male data coupling connector with coupling pins and the other of the first and second data coupling connectors is a female data coupling connector with coupling pin receptors, the first and second data coupling connectors are mated when the system plane is engaged with the mid-plane.

8. The modular server of claim 1 wherein the system plane and the mid-plane comprise:
  a first power connector assembly and a first data connector assembly disposed at a first side of the system plane;
  a second power assembly and a second data connector assembly disposed at a second side of the system plane.

9. The modular server of claim 1 wherein the mid-plane and the system plane comprise an alignment assembly, the alignment assembly comprising:
  a first alignment connector on the system plane;
  a second alignment connector on the mid-plane; and
  wherein one of the first and second alignment connectors is a male alignment connector with an alignment pin and the other of the first and second alignment connectors is a female alignment connector with an alignment pin receptor, the first and second alignment connectors facilitate alignment of the system plane with the mid-plane.

10. The modular server of claim 9 wherein the system plane and the mid-plane comprise:
  a first alignment assembly disposed at a first side of the system plane; and
  a second alignment assembly disposed at a second side of the system plane.

11. The modular server of claim 1 wherein the system components of the system plane comprise:
  a plurality of memory slots;
  a plurality of PCIe slots; and
  a plurality of network connections.

12. The modular server of claim 11 wherein the plurality of network connections comprises different types of network interfaces.

13. The modular server of claim 11 wherein:
  the system plane is disposed on a server tray having a connection panel; and
  the connection panel comprises a plurality of connectors for the plurality of network connections.

14. The modular server of claim 1 wherein the system plane comprises first and second processor modules, wherein a processor module comprises a plurality of processors.

15. A modular server comprising:
  a system tray, the system tray includes,
    a processor module,
    system components, and
    wherein the system tray serves as a system plane;
  a server chassis, the server chassis having first and second opposing ends, wherein the server chassis,
    houses a storage plane containing hard drives of the server,
    houses a mid-plane, the mid-plane comprises a power module, the mid-plane is coupled to the storage plane proximate to the first end of the server chassis, and
    is configured to accommodate insertion and removal of the system plane proximate to the second end of the server chassis, the system plane which includes the processor module slides in a parallel direction relative to the adjacent mid plane having the power module for coupling the system plane to and decoupling the system plane from the mid-plane; and power and data connector assemblies disposed on the mid-plane and the system plane, the power and data connector assemblies couple power and data signals between the system plane and the storage plane via the mid-plane when the system plane is engaged with the mid-plane, the power and data connector assemblies facilitate easy coupling of the system plane to the mid-plane for inserting the system plane into the server chassis and easy decoupling of the system plane from the mid-plane for removing the system plane from the server chassis.

16. The modular server of claim 15 wherein the mid-plane and the system plane comprise an alignment assembly, the alignment assembly comprising:

a first alignment connector on the system plane;

a second alignment connector on the mid-plane; and wherein one of the first and second alignment connectors is a male alignment connector with an alignment pin and the other of the first and second alignment connectors is a female alignment connector with an alignment pin receptor, the first and second alignment connectors facilitate alignment of the system plane with the mid-plane.

17. The modular server of claim 15 wherein the system components of the system plane comprise:

a plurality of memory slots;

a plurality of PCIe slots; and a plurality of network connections.

18. The modular server of claim 15 wherein the system plane comprises a lock module, the lock module, when in the lock position, locks the system plane to the server chassis to ensure engagement of the system plane to the mid-plane; and in the unlock position, enables insertion and removal of the system plane for engaging and disengaging the system plane with the mid-plane.

19. The modular server of claim 18 wherein the lock module comprises first and second lock levers disposed on first and second sides of the system plane, the levers rotate from lock to unlock positions.

20. The modular server of claim 15 wherein:

the power connector assembly comprises a first power coupling connector on the system plane and a second power coupling connector on the mid-plane, wherein one of the first and second power coupling connectors is a male power coupling connector with coupling pins and the other of the first and second power coupling connectors is a female power coupling connector with coupling pin receptors, the first and second power coupling connectors are mated when the system plane is engaged with the mid-plane; and the data connector assembly comprises a first data coupling connector on the system plane and a second data coupling connector on the mid-plane, wherein one of the first and second data coupling connectors is a male data coupling connector with coupling pins and the other of the first and second data coupling connectors is a female data coupling connector with coupling pin receptors, the first and second data coupling connectors are mated when the system plane is engaged with the mid-plane.

21. The modular server of claim 1 wherein:

the first end comprises a front end of the server chassis which is proximate to the front of the modular server which is mounted onto a server rack; and the second end comprises a rear end of the server chassis which is proximate to the rear of the modular server.

22. The modular server of claim 15 wherein:

the first end comprises a front end of the server chassis which is proximate to the front of the modular server which is mounted onto a server rack; and the second end comprises a rear end of the server chassis which is proximate to the rear of the modular server.

23. The modular server of claim 15 wherein the mid-plane comprises first and second mid-plane sections, wherein:

the first mid-plane section extends to the second end of the server chassis; and the second mid-plane section is retracted from the second end of the server chassis to accommodate the system plane.

24. The modular server of claim 23 wherein the first mid-plane section comprises a power module.

* * * * *